United States Patent
Naujokat

(10) Patent No.: US 7,626,437 B2
(45) Date of Patent: Dec. 1, 2009

(54) CIRCUIT ASSEMBLY FOR CONVERTING A DIFFERENTIAL INPUT CLOCK SIGNAL PAIR INTO A SINGLE-ENDED OUTPUT CLOCK SIGNAL

(75) Inventor: Joern Naujokat, Freising (DE)

(73) Assignee: Texas Instruments Deutschland GmbH, Freising (DE)

( * ) Notice: Subject to any disclaimer, the term of this patent is extended or adjusted under 35 U.S.C. 154(b) by 639 days.

(21) Appl. No.: 10/316,337

(22) Filed: Dec. 11, 2002

(65) Prior Publication Data

US 2003/0128065 A1 Jul. 10, 2003

(51) Int. Cl.
*H03K 3/00* (2006.01)
(52) U.S. Cl. .......... 327/298; 327/563; 327/52; 330/255
(58) Field of Classification Search .......... 327/298, 327/291, 293, 294, 51, 52, 53, 560–563; 330/253, 255, 257, 252, 83; 326/60, 68, 326/86, 81, 83, 65, 66, 70, 77, 78, 79, 89, 326/88
See application file for complete search history.

(56) References Cited

U.S. PATENT DOCUMENTS

| | | | | |
|---|---|---|---|---|
| 4,622,480 A | * | 11/1986 | Uchimura et al. | 327/337 |
| 4,893,092 A | * | 1/1990 | Okamoto | 330/253 |
| 4,912,425 A | * | 3/1990 | Kobayashi et al. | 330/253 |
| 5,670,910 A | * | 9/1997 | Kato | 330/253 |
| 5,699,014 A | * | 12/1997 | Haefner et al. | 330/253 |
| 5,751,186 A | * | 5/1998 | Nakao | 327/562 |
| 6,049,229 A | * | 4/2000 | Manohar et al. | 326/83 |
| 6,069,532 A | * | 5/2000 | Shulman | 330/253 |
| 6,154,096 A | * | 11/2000 | Chien | 331/17 |
| 6,472,907 B2 | * | 10/2002 | Setogawa | 326/83 |
| 6,657,474 B2 | * | 12/2003 | Varadarajan | 327/291 |
| 6,809,566 B1 | * | 10/2004 | Xin-LeBlanc | 327/156 |
| 2002/0130686 A1 | * | 9/2002 | Forbes | 326/98 |

FOREIGN PATENT DOCUMENTS

JP 8111-84 * 6/1994

* cited by examiner

*Primary Examiner*—An T Luu
(74) *Attorney, Agent, or Firm*—John J. Patti; Wade J. Brady, III; Frederick J. Telecky, Jr.

(57) ABSTRACT

A circuit assembly for converting a differential input clock signal pair into a single-ended output clock signal comprises a NMOS differential amplifier (20) including two N-channel field-effect transistors (N1, N2) which converts the input clock signal pair (CLK, NCLK) applied to its differential inputs into a first single-ended signal, a PMOS differential amplifier (22) including two P-channel field-effect transistors (P3, P4) which converts the input clock signal pair applied to its differential inputs into a second single-ended signal, a bias circuit (N5, N6, N7, P5, P6) generating for each differential amplifier a bias voltage defining its working point at which said field-effect transistors (N1, N2; P3, P4) change state as a function of said input clock signal pair (CLK, NCLK), and a NAND circuit (32) for linking said first and said second single-ended signal and outputting the single-ended output clock signal (A-CLK) as the result thereof.

4 Claims, 1 Drawing Sheet

CIRCUIT ASSEMBLY FOR CONVERTING A DIFFERENTIAL INPUT CLOCK SIGNAL PAIR INTO A SINGLE-ENDED OUTPUT CLOCK SIGNAL

FIELD OF THE INVENTION

The invention relates to a circuit assembly for converting a differential input clock signal pair into a single-ended output clock signal.

BACKGROUND OF THE INVENTION

For clocking memory devices, phase lock loops (PLLS) are usually employed which receive a reference clock signal generated by the clock and generate therefrom a control clock signal phase-locked thereto for controlling the memory. For noise immunity both the reference clock signal and the control clock signal are each provided as a differential clock signal pair. Since the phase-frequency detector usually contained in the PLL requires single-ended signals for implementing the phase comparison, both the reference clock signal pair generated by the reference clock and the control clock signal pair output by the PLL need to be converted into a single-ended signal. One example of such a circuit assembly in which this signal conversion is made use of in conjunction with a PLL is to be found in the Texas Instruments type CDCV857A integrated circuit, a data sheet of which was publicized in April 2001. On page 2 of this data sheet both the reference clock signal pair and the feedback control clock signal pair have a separate circuit assembly for converting these differential clock signal pairs into single-ended signals.

For proper functioning of the PLL, the shift in phase between the control clock signal pair output thereby and the reference clock signal pair supplied to it by the reference clock is of salient importance since it is from this phase difference that the error signal is generated with the aid of which phase locking is implemented. It is thus a mandatory requirement that the circuit assemblies used for converting each signal pair into single-ended signals must not produce any phase shift which falsifies the existing phase shift between the feedback control clock signal pair and the reference clock signal pair generated by the reference clock. In other words, there must be no skew in the circuit assemblies. Since, however, the signals to be converted in each case originate from different sources, the voltages at points at which the edges of each differential clock signal pair cross jitter. It is due to this jitter that skew materializes in conversion, resulting in the phase relationship of the signals to be compared in the phase-frequency detector being falsified in and thus no longer ensuring phase locking to the frequency of the reference clock signal pair. Clocking advanced memory devices necessitates, however, a highly accurate phase and frequency control, since even a picosecond skew may already cause a false response of such memory devices.

SUMMARY OF THE INVENTION

The invention includes the objective of providing a circuit assembly of the kind in which the desired conversion of the differential clock signal pairs into a single-ended clock signal can now be implemented with a signal delay which is immune to any jitter of the cross-point voltage.

This objective is achieved in accordance with the invention in a circuit assembly of the kind by a NMOS differential amplifier including two N-channel field-effect transistors which converts the input clock signal pair applied to its differential inputs into a first single-ended signal, a PMOS differential amplifier including two P-channel field-effect transistors which converts the input clock signal pair applied to its differential inputs into a second single-ended signal, a bias circuit generating for each differential amplifier a bias voltage defining its working point at which the field-effect transistors change state as a function of the input clock signal pair, and a NAND circuit for linking the first and the second single-ended signal and outputting the single-ended output clock signal as the result thereof.

It is now possible to generate the single-ended output clock signal from the differential input clock signal pair supplied thereto without influencing the phasing of the leading edges required for further processing by the level of the voltage at the point at which the edges of the input clock signal pair cross. This unwanted influence does not occur because the propagation delay in the circuit assembly is now independent of the cited voltage level.

BRIEF DESCRIPTION OF THE DRAWINGS

The invention will now be explained by way of example with reference to the drawing in which.

DETAILED DESCRIPTION OF THE DRAWINGS

Figure 1:
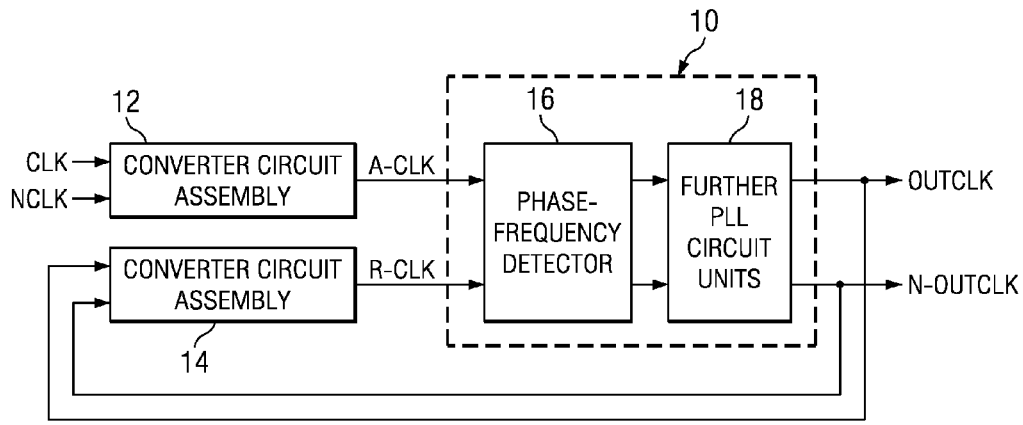
FIG. 1 is a block circuit diagram assisting in explaining how the circuit assembly in accordance with the invention is used in a PLL and FIG. 2 is a circuit diagram of the circuit assembly in accordance with the invention.

Referring now to FIG. 1 in explaining the circuit assembly in accordance with the invention it is to be noted that it is to be employed in a dual configuration together with a PLL 10. One circuit assembly 12 has the task of converting a differential reference input clock signal pair CLK and NCLK furnished by a reference clock (not shown) into a single-ended reference output clock signal ACLK whilst the second circuit assembly 14 serves to convert the differential control clock signal pair OUTCLK and N-OUTCLK output at the output of the PLL 10 into a single-ended feedback output clock signal R-CLK. The two output clock signals A-CLK and R-CLK are supplied to a phase-frequency detector 16 in the PLL which compares them and produces an error signal as a function of the phase difference existing between them which is used in the further circuit units of the PLL 10 illustrated diagrammatically as block 18 by phase locking.

Phase locking one edge of the input clock signal pairs is used as the reference. This is why the following description considers the leading edge of the input clock signal CLK and of the reference output clock signal A-CLK. Since the input clock signals CLK and NCLK are complementary to each other, the same considerations apply likewise to the trailing edge of the input clock signal NCLK.

Figure 2:
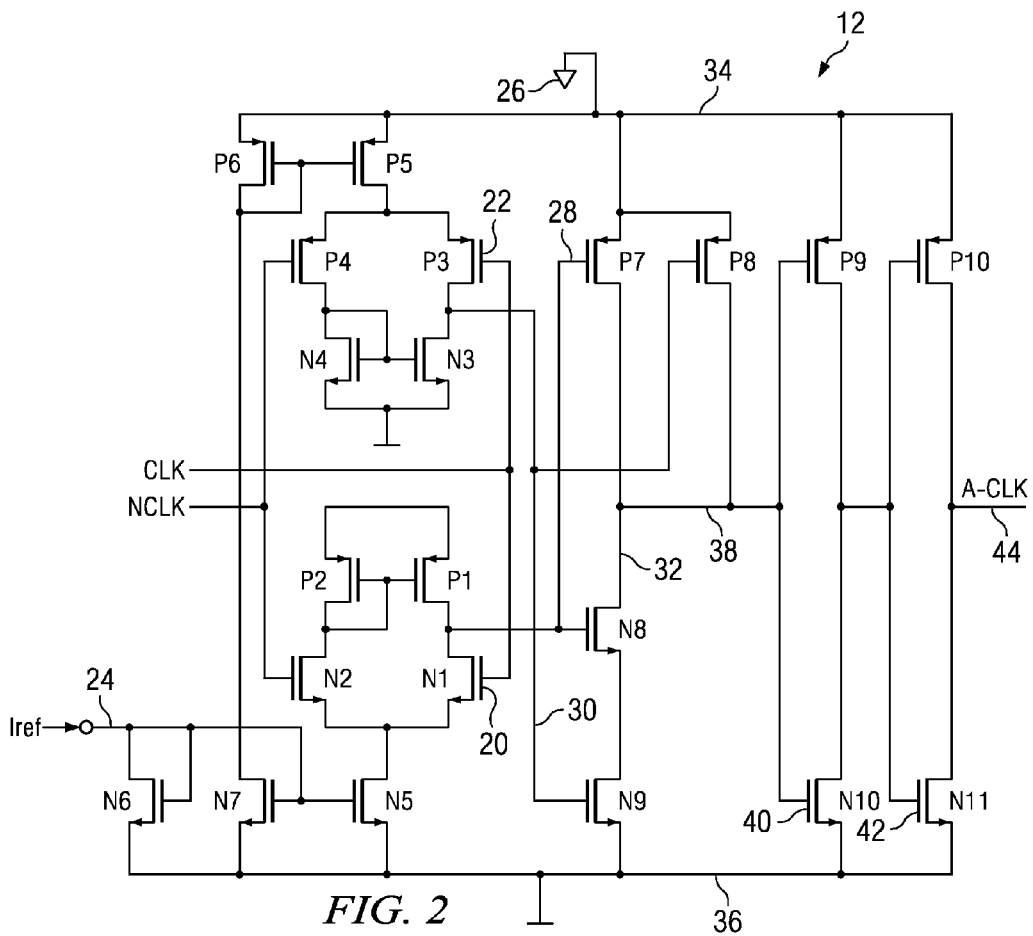

Referring now to FIG. 2, there is illustrated the circuit diagram of the converter circuit assembly 12. The circuit assembly 12 contains a NMOS differential amplifier 20 including two N-channel field-effect transistors N1 and N2 to which a P-channel field-effect transistor P1 and P2 respectively is connected in series. The P-channel field-effect transistors P1 and P2 are connected to each other like a current mirror, each of which conducts the load currents of the N-channel field-effect transistors N1 and N2 respectively.

In addition, the circuit assembly 12 comprises a second PMOS differential amplifier 22 including two P-channel field effect transistors P3 and P4. With these P-channel fields effect transistors P3 and P4, one N-channel field-effect transistor N3 and N4 respectively is connected in series. These two N-channel field-effect transistors are connected to each other like a current mirror and each conducts the load currents of the P-channel field effect transistors P3 and P4 respectively. The reference input clock signal CLK is connected to the gates of the field-effect transistors N1 and P3 while the complementary reference input clock signal NCLK is connected to the gates of the field effect transistors N2 and P4.

To define the working points of the differential amplifiers 20 and 22, a bias circuit is provided which, depending on the reference current supplied to an input 24, applies a specific bias voltage to the connected sources of the N-channel field-effect transistors N1 and N2 and to the connected sources of the P-channel field effect transistors P3 and P4. This bias voltage is generated at the NMOS differential amplifier 20 with the aid of an N-channel field-effect transistor N5 whose source-drain connection is located between the connected sources of the Nchannel field-effect transistors N1 and N2 and ground. At the PMOS differential amplifier 22, this bias voltage is generated with the aid of a P-channel field-effect transistor P5 whose source-drain connection is located between the supply voltage terminal 26 and the connected sources of the P-channel field-effect transistors P3 and P4. The source-drain voltage drop of the N-channel field-effect transistor N5 and P-channel field-effect transistor P5 respectively is achieved by the current Iref being mirrored in the field-effect transistors N5 and P5 by a dual current mirror comprising N-channel field-effect transistors N6 and N7 as well as a P-channel field-effect transistor P6.

The output signals of the two differential amplifiers 20 and 22 are supplied via conductors 28 and 30 respectively to a NAND circuit 32 comprising N-channel field-effect transistors N8 and N9 as well as P-channel field-effect transistors P7 and P8. It is evident that the source-drain connections of the field-effect transistors P7, N8 and N9 are connected in series between the conductor 34 connecting the supply voltage terminal 26 and the ground conductor 36 while the source-drain connection of the field-effect transistor P8 is located between the conductor 34 and the point connecting the drain of the P-channel field-effect transistor P7 and the drain of the N-channel field-effect transistor N8. The signal output by the differential amplifier 20 in this arrangement is supplied to the gates of the field-effect transistors N8 and P7 while the signal output by the differential amplifier 22 is applied to the gates of the field-effect transistor P8 and field-effect transistor N9.

The output signal of the NAND circuit 32 at conductor 38 is supplied via two amplifier and signal shaper stages 40 and 42 to the circuit output 44 at which the desired single-ended output clock signal A-CLK is output. The stages 40 and 42 each comprise a P-channel field-effect transistor P9 and an N-channel field-effect transistor N10 connected in series therewith or a P-channel field-effect transistor P10 and an N-channel field-effect transistor N11 connected in series therewith between the conductor 34 at supply voltage potential and conductor 36 at ground potential. The gates and drains of the field-effect transistors P9 and N10 and the field-effect transistors P10 and N11 are each connected to each other.

The circuit assembly 12 as described functions as follows:

Applying a reference current Iref to the input 24 results in a current corresponding to the reference current Iref due to the current mirror response of the transistors N6, N5, N7 as well as P6 and P5 also flowing through the transistors N5 and P5. This current results in a specific drain-source voltage being applied to the transistors N5 and P5. It is this voltage that enables the working points of the differential amplifiers 20 and 22 to be set.

An increase in the input clock signal CLK from low to high then results in the N-channel field-effect transistor N1 changing from being turned off to turned on as soon as the level of the voltage of the input clock signal CLK exceeds the sum of the source-drain voltage of the N-channel field-effect transistor N5 and the threshold voltage of the N-channel field-effect transistor N1. Since the gate of the N-channel field-effect transistor N2 receives the complementary input clock signal NCLK whose voltage level changes opposite to the input clock signal CLK, this field-effect transistor is turned off as soon as the voltage of the input clock signal NCLK drops below the sum of the source-drain voltage of the field-effect transistor N5 and the threshold voltage of the field-effect transistor N2.

In the switching action as just described, it is assumed that the voltage level at which the edges of the input clock signals CLK and NCLK cross is higher than the sum level as explained above. This means that the N-channel field-effect transistors N1 and N2 are driven into saturation permitting very fast switching action of the field-effect transistor N1. This fast reaction to the leading edge of the input clock signal CLK results in a change from low to high due to the low voltage level on the conductor 28 at its output conductor 38. A corresponding signal is likewise output as the desired output clock signal A-CLK on the conductor 44 following corresponding signal shaping in the stages 40 and 42.

The high cross-point voltage of the differential input clock signal pair CLK and NCLK thus results in only a minor delay existing between the leading edge of the input clock signal CLK and the leading edge of the single-ended output clock signal A-CLK.

Due to the high cross-point voltage and the fixed set working point of the PMOS differential amplifier 22, the P-channel field effect transistors P3 and P4 contained therein are not driven into saturation so that the leading edge of the input clock signal CLK results only in a delayed change in state of the P-channel field effect transistors P3 and P4. Accordingly, the voltage on the conductor 30 does not change from high to low until after a delay which, however, has no effect on the circuit assembly 12 since due to the NAND logic the switching edge already occurring earlier in time on the conductor 28 has resulted in a leading edge on the conductor 38 and at the output 44.

Assuming now that the voltage at the crossing point of the edges of the differential input clock signal pair CLK and NCLK is lower than the sum of the source-drain voltage of the N-channel field-effect transistor N5 and the threshold voltage of the N-channel field-effect transistors N1 and N2, then under these conditions, due to the shift in the working point, the PMOS differential amplifier 22 is driven into saturation of P-channel field effect transistors P3 and P4 while the N-channel field-effect transistors N1 and N2 in the NMOS differential amplifier 20 operate below the threshold voltage, i.e. are not driven into saturation. This results in P-channel field effect transistors P3 and P4 being able to quickly react to the leading edge of the input clock signal CLK because of the low level at the crossing point of the edges of the differential input clock signal pair CLK, NCLK. In this arrangement, P-channel field effect transistor P3 changes from being turned on to turned off while P4 changes from being turned off to turned on, thus causing the signal at the conductor 30 to change from high to low with a slight delay which due to the NAND logic of the NAND circuit 32 causes the level of the signal at the conductor 38 to change from low to high. This accordingly results in a single-ended output clock signal A-CLK having a leading edge being generated corresponding to the input clock signal CLK.

The change in state of the N-channel field-effect transistors N1 and N2 in the NMOS differential amplifier 20 occurs due to the low of the cross-point voltage being substantially more delayed so that also the high to low change in the signal at the conductor 28 occurs more delayed which, however, has no effect on the output signal of the NAND circuit 32 at the conductor 38 since this has already changed to high. In other words, due to the reaction as described above it is always the differential amplifiers whose field-effect transistors are driven into saturation that produce a leading edge of the single-ended output clock signal A-CLK in response to a leading edge of the input clock signal CLK after a short delay which is always the same. The delay between the two edges is thus independent of the level of the voltage at the crossing point of the edges of the different input clock signals. It is this independence of the propagation delay from the cross-point voltage in the change of the differential signals into a single-ended signal as implemented by the circuit assembly 12 that is the requirement for precise phase locking in the PLL 10 since the phasing of the clock signals supplied to the phase-frequency detector 16 is now no longer falsified in conversion.

The invention claimed is:

1. An apparatus for converting a first differential clock signal and a second differential clock signal into a single-ended output clock signal, the apparatus comprising:
   a first voltage rail;
   a second voltage rail;
   an NMOS differential amplifier having a first input terminal, a second input terminal, and an output terminal, wherein the first input terminal of the NMOS differential amplifier receives the first differential clock signal, and wherein the second input terminal of the NMOS differential amplifier receives the second differential clock signal;
   a PMOS differential amplifier having a first input terminal, a second input terminal, and an output terminal, wherein the first input terminal of the PMOS differential amplifier receives a first differential clock signal, and wherein the second input terminal of the PMOS differential amplifier receives a second differential clock signal
   a bias circuit including:
      a first PMOS FET that is coupled to the PMOS differential amplifier at its drain and that is coupled to the first voltage rail at its source;
      a second PMOS FET that is diode-connected, that is coupled to the gate of the first PMOS FET at its gate, and that is coupled to the first voltage rail at its source;
      a first NMOS FET that is coupled to the NMOS differential amplifier at its drain and that is coupled to the second voltage rail at its source;
      a second NMOS FET that is coupled to the gate of the first NMOS FET at its gate, that is coupled to the second voltage rail at its source, and that is coupled to the drain of the second PMOS FET at its drain; and
      a third NMOS FET that is diode-connected, that is coupled to the gate of the second NMOS FET at its drain, and that is coupled to the second voltage rail at its source, wherein the third NMOS FET receives a bias current at its drain;
   a NAND gate that is coupled to the output terminals of the PMOS and NMOS differential amplifiers;
   a first inverter that is coupled to the NAND gate; and
   a second inverter that is coupled to the first inverter, wherein the second inverter outputs the single-ended output clock signal.

2. The apparatus of claim 1, wherein the NMOS differential amplifier further comprises
   a third PMOS FET that is diode-connected;
   a fourth PMOS FET that is coupled to the source of the first PMOS FET at its source, and that is coupled to the gate of the third PMOS FET at its gate;
   a fourth NMOS FET that receives the first differential clock signal at its gate, that is coupled at is drain to the drain of the third PMOS FET; and
   a fifth NMOS FET that receives the second differential clock signal at its gate, that is coupled to the drain of the fourth PMOS FET at its drain, and that is coupled to the source of the fourth NMOS FET at its source.

3. The apparatus of claim 1, wherein the PMOS differential amplifier further comprises:
   a fourth NMOS FET that is diode-connected;
   a fifth NMOS FET that is coupled to the source of the fourth NMOS FET at its source and that is coupled to the gate of the fourth NMOS FET at its gate;
   a third PMOS FET that receives the first differential clock signal at its gate, that is coupled at is drain to the drain of the fourth NMOS FET; and
   a fourth PMOS FET that receives the second differential clock signal at its gate, that is coupled to the drain of the fifth NMOS FET at its drain, and that is coupled to the source of the third PMOS FET at its source.

4. The apparatus of claim 1, wherein the NAND circuit further comprises:
   a third PMOS FET that is coupled to first voltage rail at its source and that is coupled to the output terminal of the NMOS differential amplifier at its gate;
   a fourth PMOS FET that is coupled to first voltage rail at its source and that is coupled to the output terminal of the PMOS differential amplifier at its gate;
   a fourth NMOS FET that is coupled to the drains of the third and fourth PMOS FETs at its drain and that is coupled to the output terminal of the NMOS differential amplifier at its gate; and
   a fifth NMOS FET that is coupled at its source to the second voltage rail, that is coupled to the source of the fourth NMOS FET at its drain, and that is coupled to the output terminal of the PMOS differential amplifier at its gate.

* * * * *

UNITED STATES PATENT AND TRADEMARK OFFICE
CERTIFICATE OF CORRECTION

| | | |
|---|---|---|
| PATENT NO. | : 7,626,437 B2 | Page 1 of 1 |
| APPLICATION NO. | : 10/316337 | |
| DATED | : December 1, 2009 | |
| INVENTOR(S) | : Joern Naujokat | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 496 days.

Signed and Sealed this

Second Day of November, 2010

David J. Kappos
*Director of the United States Patent and Trademark Office*